United States Patent [19]

Kolm et al.

[11] Patent Number: 4,458,171

[45] Date of Patent: Jul. 3, 1984

[54] PIEZOELECTRIC RELAY WITH TAPERED MAGNETIC DETENT

[75] Inventors: Eric A. Kolm, Brookline; Henry H. Kolm, Wayland, both of Mass.

[73] Assignee: Piezo Electric Products, Inc., Cambridge, Mass.

[21] Appl. No.: 448,471

[22] Filed: Dec. 15, 1982

Related U.S. Application Data

[63] Continuation-in-part of Ser. No. 338,228, Jan. 11, 1982.

[51] Int. Cl.³ .............................................. H01L 41/08

[52] U.S. Cl. .................................... 310/330; 310/332; 200/181; 335/170; 335/196

[58] Field of Search ................................ 310/330-332, 310/339; 200/181; 335/170, 196

[56] References Cited

U.S. PATENT DOCUMENTS

| | | | |
|---|---|---|---|
| 2,342,527 | 2/1944 | Bucklen | 335/196 X |
| 3,125,652 | 3/1964 | Richert | 335/196 |
| 3,914,723 | 10/1975 | Goodbar | 335/170 X |
| 4,019,163 | 4/1977 | Beavitt | 335/196 X |

FOREIGN PATENT DOCUMENTS

| | | | |
|---|---|---|---|
| 2811524 | 9/1979 | Fed. Rep. of Germany | 310/332 |
| 1096824 | 12/1967 | United Kingdom | 200/181 |
| 565333 | 8/1977 | U.S.S.R. | 200/181 |

*Primary Examiner*—Mark O. Budd
*Attorney, Agent, or Firm*—Joseph S. Iandiorio

[57] ABSTRACT

A magnetically detented piezoelectric relay including a piezoelectric bender element having a fixed portion and a movable portion; means for providing an actuating voltage to deflect the bender element; first contact means mounted on the movable portion; second stationary contact means remote from the bender element and proximate the first contact means for selective engagement therewith in response to deflection of the bender element; and magnetic circuit means including a magnet; a first stationary pole member; and a second pole member on the movable portion for magnetically adhering the movable portion to the first pole member until the deflection force of the bender element exceeds the holding force of the magnetic circuit; one of the first and second pole members is convergingly tapered toward its face and has a face of reduced area relative to the area of the face of the other of the first and second pole members; at least one of the first and second pole members is movable toward and away from the other to adjust the length of the gap between them.

24 Claims, 10 Drawing Figures

PIEZOELECTRIC RELAY WITH TAPERED MAGNETIC DETENT

CROSS REFERENCE

This application is a continuation-in-part of U.S. patent application Ser. No. 338,228, filed Jan. 11, 1982, Kolm et al., entitled "Piezoelectric Relay with Magnetic Detent".

FIELD OF INVENTION

This invention relates to a magnetically detented piezoelectric relay, and more particularly to such a relay with an improved magnetic detent.

BACKGROUND OF INVENTION

Piezoelectric relays driven by piezoelectric bending elements may employ a snap-action or bistable device to accumulate energy supplied by the piezoelectric bending element. See Ser. No. 200,390, filed Oct. 24, 1980, incorporated herein by reference. The full drive voltage is applied initially. When sufficient energy is stored actuation occurs, whereupon the snap-action device produces quick, decisive operation.

In some applications full drive voltage is not initially available. The drive voltage is a slowly varying control voltage, such as encountered in automatic street light systems, which must nevertheless produce a quick, positive actuation when the operating voltage is reached. For example, relays used to turn street lights on and off at dusk and dawn must operate consistently at a predetermined voltage level of the slowly varying control voltage from a photosensitive element. The switching should occur at a relatively high level of illumination well above the condition of total darkness. The switching must be abrupt and positive to prevent contact chatter and consequent arcing and deterioration of the contacts.

Attempts to use a snap-action device in combination with a piezoelectric bending element resulted in less than desired response. The contact force becomes zero before the contacts open and a part of the actuating stroke is dissipated in premature motion as the contacts start to close. The mechanical detenting action of the snap-action device or overcenter spring device is not adequate: it introduces an amount of motion which is significant relative to the available contact stroke. Piezoelectric devices produce very little motion, more on the order of motion produced by thermal expansion rather than the swing of armature relays. This makes even more difficult the problem of producing a practical, reproducible piezoelectric relay.

SUMMARY OF INVENTION

It is therefore an object of this invention to provide an improved piezoelectric relay which provides a quick, decisive action to positively open and close electrical contacts.

It is a further object of this invention to provide such an improved piezoelectric relay utilizing an improved detenting technique without the need for costly or complex mechanical arrangements.

It is a further object of this invention to provide such an improved piezoelectric relay which uses a magnetic detent.

It is a further object of this invention to provide such an improved piezoelectric relay in which the holding force, the force gradient and the gap length of magnetic detent action may be closely controlled.

The invention results from the realization that a truly effective piezoelectric relay with sharp switching action can be accomplished by using a magnetic detent to restrain the motion of the contacts until a predefined switching force level is attained, and that the detent action can be closely controlled using a tapered pole member which has a reduced face area relative to a confronting pole face.

The invention features a magnetically detented piezoelectric relay. It includes a piezoelectric bender element having a fixed portion and a movable portion. There are means for providing an actuating voltage to deflect the bender element. First contact means are mounted on the movable portion; second stationary contact means remote from the bender element and proximate the first contact means selectively engage with the first contact means in response to the deflection of the bender element. Magnetic circuit means include a magnet, a first stationary pole member, and a second pole member on the movable portion for magnetically adhering the movable portion to the first pole member until the deflection force of the bender element exceeds the holding force of the magnetic circuit. One of the pole members is convergingly tapered toward its face.

In a preferred embodiment the pole face of the tapered pole member is of reduced area relative to the face of the other pole member. At least one of the pole members is movable toward and away from the other to adjust the gap between them. There may be a third stationary pole member spaced from the first with the movable portion between them. The first and third pole members are movable together to adjust their position relative to the movable portion. The first and second contact means are in the magnetic circuit. The second pole member may be included in the first contact means, and the second contact means may be mounted with the first pole member and may include magnetic material. The magnet may be a permanent magnet or an electromagnet. The means for providing an actuating voltage may include electrode means, and may further include a voltage source.

The first contact means may include a first contact member on the movable portion on the side facing the second contact means, a second contact member on the opposite side of the movable portion, and third contact means remote from the bender element and proximate the second contact means for selective engagement therewith.

DISCLOSURE OF PREFERRED EMBODIMENT

Other objects, features and advantages will occur from the following description of a preferred embodiment and the accompanying drawings, in which.

Figure 1:
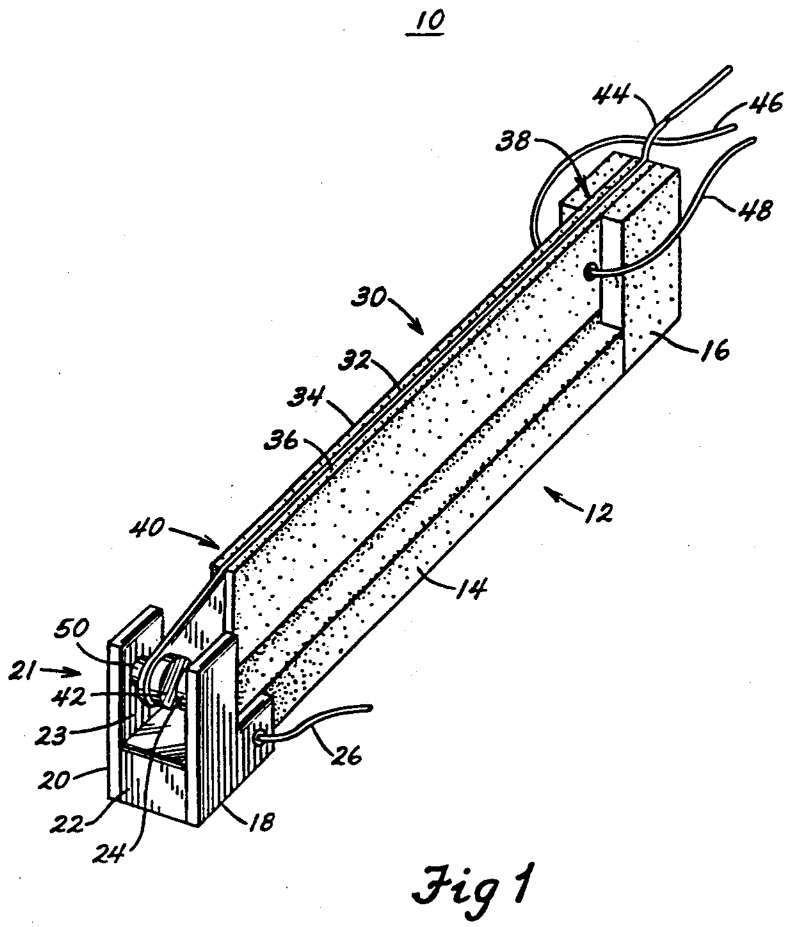
FIG. 1 is an axonometric view of a piezoelectric relay according to this invention.

There is shown in FIG. 1 a piezoelectric relay 10 according to this invention which includes a frame 12 comprising a plastic rail 14 and mounting block 16. Iron pole plates 18 and 20 are mounted at one end of rail 14 spaced from each other with permanent magnet 22 between them. Pole plate 18 carries stationary contact 24, which is electrically connected to pole plate 18 and externally connected through electrode 26. Piezoelectric bender 30 includes metal blade 32 sandwiched between piezoelectric plates 34 and 36. Bender 30 may have only one piezoelectric plate rather than two, as shown. Such benders, also known as non-symmetrical monolams, are generally used to produce deflection in one direction only. Fixed portion 38 of bender 30 is mounted in mounting block 16. The movable portion 40 of bender element 30 carries movable contact 42 proximate stationary contact 24 of pole plate 18. Contact 42 is electrically connected to metal plate 32 and makes external connection through electrode 44. Drive voltage is applied to bender element 30 through electrodes 46 and 48, which are connected to piezoelectric members 34 and 36. Contacts 24 and 42 may include or wholly consist of magnetic materials such as iron or nickel. Element 50 may also be made of magnetic material to enhance the attraction to pole plate 20. Magnetic circuit 21 extends through permanent magnet 22, pole plates 18 and 20, gap 23, contacts 24 and 42, and element 50.

Piezoelectric plates 34 and 36 may have a length of 1.25 inches, width of 0.050 inch, thickness of 0.010 inch, and be made of piezoelectric materials such as lead titanate and lead zirconate. Contacts 42 and 24 may be solid or plated iron contacts of 0.25 inch diameter. Permanent magnet 22 may provide a field strength in the 0.015 inch gap between pole plates 18 and 20 and the moving element 50, 42, which provides a holding force of about 50 grams between pole 20 and element 50 in the contact open position or between contacts 42 and 24 in the closed position. To overcome this magnetic detent, the voltage required to be applied to electrodes 46 and 48 is 150 volts. Piezoelectric bender elements are variously known in the field as benders, bimorphs, polymorphs, and bilams, and more generally as benders, bender elements or bending elements. Although herein the bender elements have been shown as using a single metal blade sandwiched between two piezoelectric elements, this is not a necessary limitation of the invention, as monolams, single, one-sided layers or multiple layers may also be used. See U.S. patent applications Ser. Nos. 222,649, filed Jan. 5, 1981; 270,370, filed June 4, 1981; and 300,025, filed Sept. 8, 1981.

Figure 2:
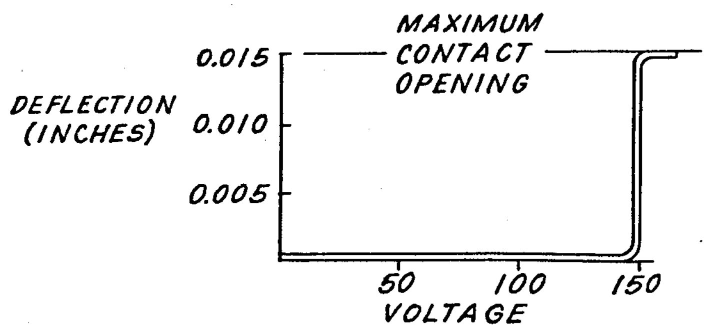
FIG. 2 illustrates the characteristic deflection with respect to applied voltage of the relay FIG. 1.

The sharp action of relay 10 is shown in FIG. 2, where an initial application of voltage produces no deflection of the movable contact until a predetermined voltage, for example 150 volts, is reached, at which point the magnetic detent force of 50 grams is abruptly and cleanly overcome and the contacts are snapped closed with a force approximately equal to the magnetic detent holding force. This sweeps movable portion 40 through the full range of the 0.015 inch gap between contacts 42 and 24.

Figure 3:
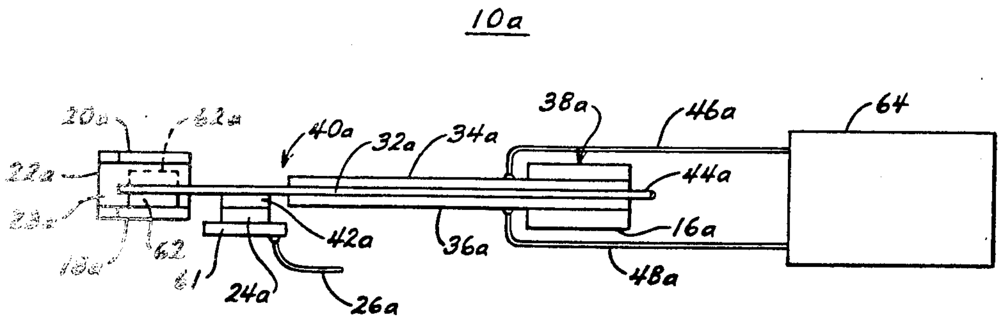
FIG. 3 is a schematic plan view in which the electrical contacts are separated from the magnetic circuit.

Although the embodiment in FIG. 1 shows the electrical contacts disposed in the magnetic circuit and being comprised partly or wholly of magnetic material, this is not a limitation of the invention. For example, in FIG. 3 contacts **42*e* and 24*a* are not magnetic material. Contact 42*a* is interconnected electrically through metal blade 32*a* to external electrode 44*a*. Contact 24*a* is mounted on support member 61 and is electrically connected through it to electrode 26*a*. In gap 23*a*, there is located a separate pole member, element 62, of magnetic material which, under the influence of the magnetic field, assists metal plate 32*a* to adhere to pole 20*a* in the open position and assists element 62 to adhere to pole 18*a* in the closed position, as shown in Fig. 3. Separate additional pole members or pieces may be added to pole plates 18, 20 or the plates themselves may act as pole members. Without element 62 present, the local area of blade 32*a* would itself act as a pole member. Element 62 may as well be placed on the opposite side of metal blade 32*a*, as shown in phantom at 62*a*, or there may be such elements on both sides of metal blade 32*a*. In this way the magnetic detent circuit and the controlled electric circuit may be isolated. Rail 14 has been omitted for clarity in FIGS. 3–6. A means in addition to electrodes 46 and 48 for applying an actuating voltage, is illustrated in the form of a source of switching voltage 64**, which will provide the necessary voltage, as shown for example in FIG. 2.

Figure 4:
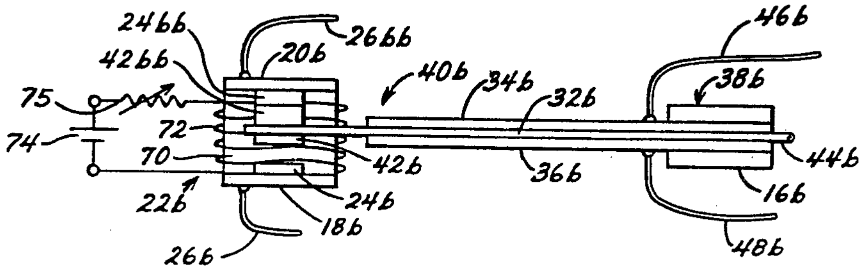
FIG. 4 is a schematic plan view for a double-pole, double-throw piezoelectric relay according to this invention utilizing an electromagnet.

The magnet that powers the magnetic circuit is not restricted to a permanent magnet. It may as well be an electromagnet **22*b*, as shown in FIG. 4, including a soft iron core 70 surrounded by winding 72 and energized by battery 74. By adjusting the current in coil 72 by means, for example, of variable resistor 75, it is possible to adjust the voltage at which the switching action occurs. It is also possible to use a combination of permanent magnet and electromagnet in order to reduce the amount of current required. FIG. 4 also illustrates a double-throw switch contstruction in which contacts 24*b* and 42*b* are complemented by a second set of contacts 24*bb* and 42*bb***.

Figure 5:
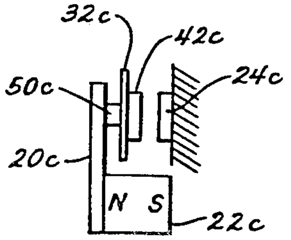
FIG. 5 is an end view of a portion of a piezoelectric relay according to this invention utilizing a single magnetic pole proximate the relay contacts.
Figure 6:
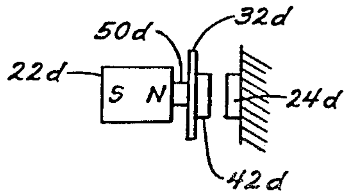
FIG. 6 is a view similar to FIG. 5 in which the magnet is located directly proximate one of the relay contacts without additional pole structure.

In certain constructions, if necessary and appropriate, one of the pole plates may be omitted so that only pole plate **20*c*, FIG. 5, remains, or both independent pole plates may be omitted with magnet 22*d***, FIG. 6, becoming the pole.

Figure 7:
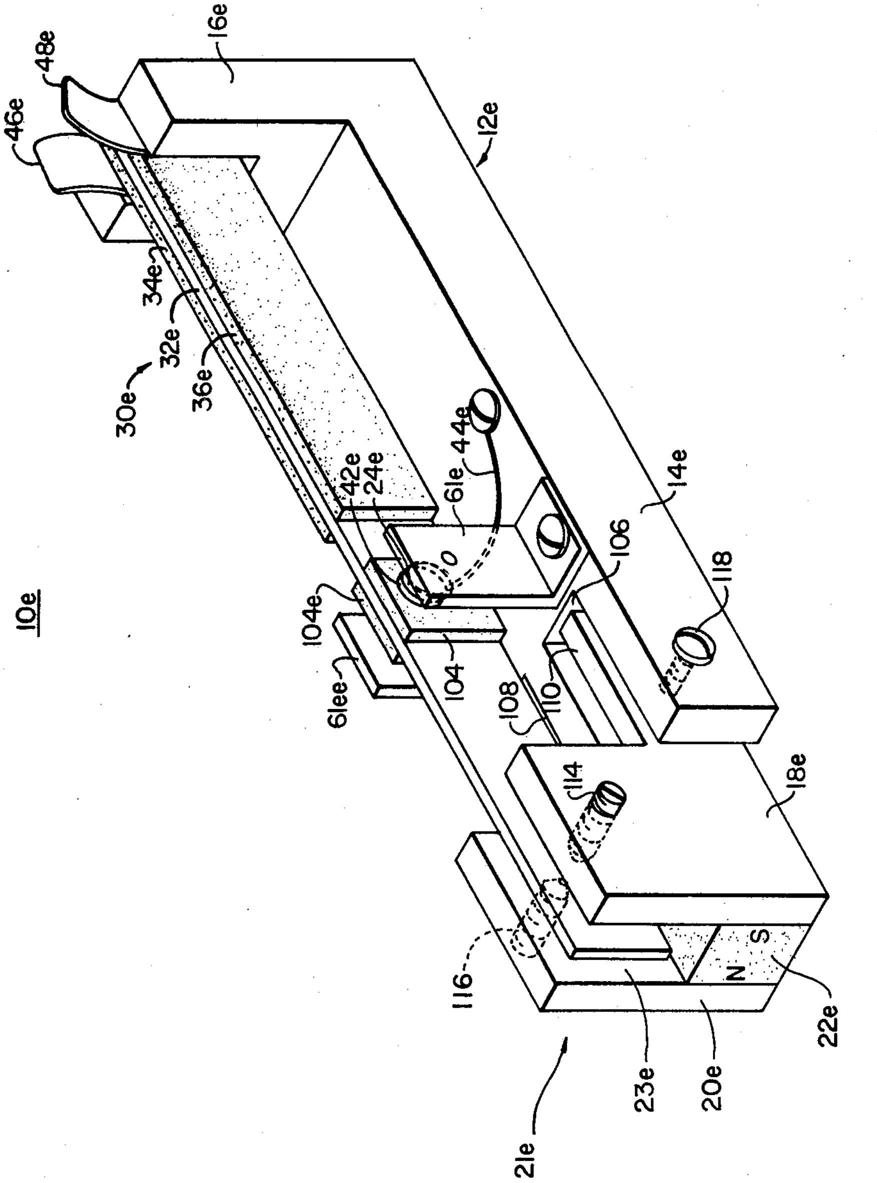
FIG. 7 is an axonometric view of a piezoelectric relay with tapered pole members according to this invention.

More precise control over the magnetic detent can be had with relay **10*e*, FIG. 7. In contrast to ealier figures, frame 12*e* is made with rail 14*e* and block 16*e* integrally formed and there are two sets of contacts: contacts 42*e* and 24*e* mounted on supports 104 and 61*e*, respectively, and contacts 42*ee* (not visible) and 24*ee* (not visible) mounted on supports 104*e* and 61*ee*, respectively. Metal plate 32*e* is typically magnetic shim stock to enhance the operation of magnetic circuit 21*e***.

Relay **10*e* provides a number of features which enhance control over the magnetic detent action. First, there are two recesses 106, 108 in frame 12*e* which receive extensions 110 and 112 (not visible) of pole plates 18*e* and 20*e*, respectively, and permit the adjustment of the position of pole plates 18*e* and 20*e* and the pole members or pieces 114, 116 relative to the end of plate 32*e* by means of screw 118. That is, the gap between pole members 114, 116 can be shifted about relative to plate 32e**.

Figure 8:
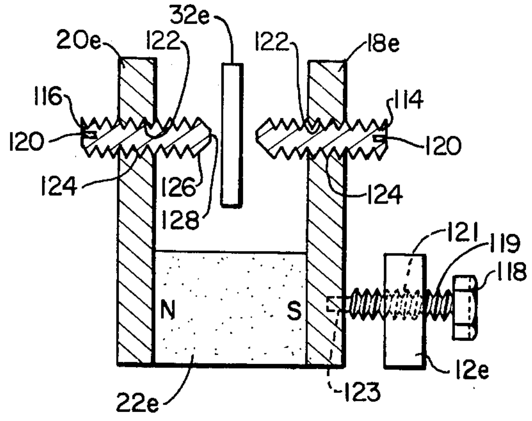
FIG. 8 is an end view of a piezoelectric relay according to the invention utilizing improved tapered, adjustable pole members.

Second, at least one of the pole members 114, 116 is independently adjustable to vary the length of gap 23e between them and pole members on plate 32e. Since the holding force of the magnetic action is a function of the reluctance and the reluctance is proportional to the pole member force area divided by the gap length, the ability to control the gap length by adjusting pole members 114, 116 provides a measure of control over the holding force. The adjustable structure is shown in FIG. 8 where pole members 114, 116 each have slots 120 to receive a screw driver blade and threads 122 which engage with threads 124 in their respective pole plates 18e, 20e. The moving end of plate 32e may have specific pole members mounted on it confronting pole members 114, 116 or plate 32e itself may function as a pole member confronting pole members 114, 116. Also shown in FIG. 8 is adjustment screw 118 whose threads 119 engage with threads 121 in frame 12e and whose end is journaled in ring 123 of pole plate 18e.

Figure 9A:
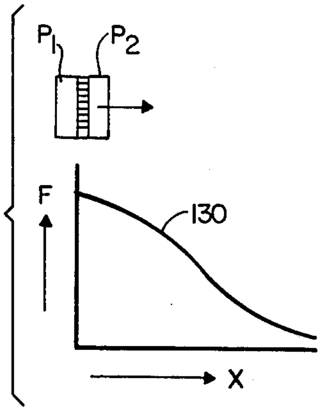
FIGS. 9A and 9B are illustrations of the force versus distance characteristics, for a conventional magnetic pole and for the tapered magnetic pole members of this invention, respectively.
Figure 9B:
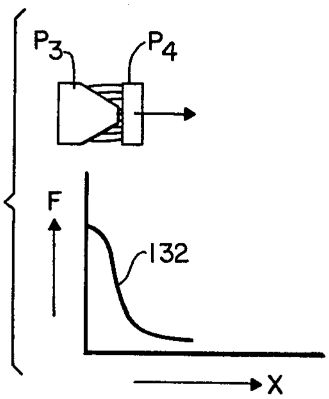

Third, each pole piece 114, 116, FIGS. 7 and 8, is formed with a tapered 126, typically conical, profile, and a pole face 128 of reduced area. The reduced area of face 128 increases the magnetic holding force over conventional confronting flat surfaces. In addition, the taper 126 provides an improved force gradient to insure rapid fall-off of the holding force as the distance increases between the magnetically attracted plate 32e and the pole member. This is illustrated in FIGS. 9A and 9B where the rather gradual decrease in force F with distance X in conventional flat confronting pole members $P_1$, $P_2$ is shown by characteristics 130, FIG. 9A, and the more desirable, sharp drop afforded by the tapered pole member $P_3$ confronting flat pole member or piece $P_4$ is illustrated by characteristic 132, FIG. 9B.

These small, additional tuning features which increase the force gradient, holding force and gap length and position are most important when understood against the background of piezoelectric action and the typical forces and distances that are encountered. In piezoelectric devices the motions are more on the order of thermal expansions than armature swings, but applicants have discovered that though these distances and forces may be very tiny they can be made to function to make a practical mass-producible relay if all of the parameters are known, understood and accounted for with the novel construction of this invention.

Other embodiments will occur to those skilled in the art and are within the following claims:

What is claimed is:

1. A magnetically detented piezoelectric relay comprising:

a piezoelectric bender element having a fixed portion and a movable portion;

means for providing an actuating voltage to deflect said bender element;

first contact means mounted on said movable portion and second stationary contact means remote from said bender element and proximate said first contact means for selective engagement therewith in response to deflection of said bender element; and magnetic circuit means including a magnet; a first stationary pole member; and a second pole member on said movable portion for magnetically adhering said movable portion to said first stationary pole member until the deflection force of said bender element exceeds the holding force of said magnetic circuit, one of said pole members being convergingly tapered toward its face.

2. The piezoelectric relay of claim 1 in which said pole member with the converging taper has a face of reduced area relative to the area of the face of the other pole member.

3. The piezoelectric relay of claim 1 in which said magnetic circuit includes a third stationary pole member spaced from said first pole member with said movable portion between them and said first and third pole members are movable together to adjust the position of the first and third pole members relative to said movable portion.

4. The piezoelectric relay of claim 1 in which said first stationary pole member is movable toward and away from said second pole member to adjust the length of the gap between them.

5. The piezoelectric relay of claim 1 in which said first and second contact means are in said magnetic circuit.

6. The piezoelectric relay of claim 5 in which said magnetic means is included in said first contact means.

7. The piezoelectric relay of claim 5 in which said second contact means is mounted on said pole means.

8. The piezoelectric relay of claim 7 in which said second contact means includes magnetic material.

9. The piezoelectric relay of claim 1 in which said magnet includes a permanent magnet.

10. The piezoelectric relay of claim 1 in which said magnet includes an electromagnet.

11. The piezoelectric relay of claim 10 in which said magnet further includes means for varying the current to said electromagnet to control the voltage at which said bender element is activated.

12. The piezoelectric relay of claim 1 in which said means for providing an actuating voltage includes electrode means.

13. The piezoelectric relay of claim 12 in which said means for providing an actuating voltage further includes a voltage source.

14. The piezoelectric relay of claim 1 in which said first contact means includes a first contact member on said movable portion on the side facing said second contact means and a second contact member on the opposite side of said movable portion, and third contact means remote from said bender element and proximate said second contact member for selective engagement therewith.

15. A magnetically detented piezoelectric relay comprising:

a piezoelectric bender element having a fixed portion and a movable portion;

means for providing an actuating voltage to deflect said bender element;

first contact means mounted on said movable portion and second stationary contact means remote from said bender element and proximate said first contact means for selective engagement therewith in response to deflection of said bender element; said first contact means including a first contact member on said movable portion on the side facing said second contact means and a second contact member on the opposite side of said movable portion, and third contact means remote from said bender element and proximate said second contact member for selective engagement therewith; and magnetic circuit means including a magnet; a first stationary pole member; and a second pole member on said movable portion for magnetically adhering said movable portion to said first stationary pole member until the deflection force of said bender element exceeds the holding force of said magnetic circuit, one of said pole members being convergingly tapered toward its face.

16. The piezoelectric relay of claim 15 in which said pole member with the converging taper has a face of reduced area relative to the area of the face of the other pole member.

17. The piezoelectric relay of claim 15 in which said magnetic circuit includes a third stationary pole member spaced from said first pole member with said movable portion between them and said first and third pole members are movable together to adjust the position of the first and third pole members relative to said movable portion.

18. The piezoelectric relay of claim 15 in which said first stationary pole member is movable toward and away from said second pole member to adjust the length of the gap between them.

19. A magnetically detented piezoelectric relay comprising:

a piezoelectric bender element having a fixed portion and a movable portion;

means for providing an actuating voltage to deflect said bender element; and magnetic circuit means, including a magnet; and first magnetic contact means mounted on said movable portion in said magnetic circuit and a second stationary magnetic contact means for selectively engaging with said first contact means in response to deflection of said bending element, one of said magnetic contacts being convergingly tapered towards its face, said contacts magnetically adhering to each other until the deflection force of said bender element exceeds the holding force of said magnetic circuit.

20. The magnetic relay of claim 19 in which said magnetic contact with the converging taper has a face of reduced area relative to the area of the face of the other magnetic contact.

21. The magnetic relay of claim 19 in which said magnetic circuit includes a third stationary magnetic contact with said movable portion between them and said second and third magnetic contacts are movable together to adjust the position of the second and third magnetic contacts relative to said movable portion.

22. The magnetic relay of claim 19 in which said stationary magnetic contact is movable toward and away from, said first magnetic contact means to adjust the length of the gap between them.

23. A magnetically detented piezoelectric relay comprising:

a piezoelectric bender element having a fixed portion and a movable portion;

means for providing an actuating voltage to deflect said bender element;

first contact means mounted on said movable portion and second stationary contact means remote from said bender element and proximate said first contact means for selective engagement therewith in response to deflection of said bender element; and magnetic circuit means including a magnet; a first stationary pole member; and a second pole member on said movable portion for magnetically adhering said movable portion to said first pole member until the deflection force of said bender element exceeds the holding force of said magnetic circuit; one of said first and second members being convergingly tapered toward its face and having a face of reduced area relative to the area of the face of the other of said first and second pole members; and said first pole member being movable toward and away from said second pole member to adjust the length of the gap between them.

24. A magnetically detented piezoelectric relay comprising:

a piezoelectric bender element having a fixed portion and a movable portion;

means for providing an actuating voltage to deflect said bender element;

first contact means mounted on said movable portion and second stationary contact means remote from said bender element and proximate said first contact means for selective engagement therewith in response to deflection of said bender element; and magnetic circuit means including a permanent magnet and an electromagnet, a first stationary pole member and a second pole member on said movable portion for magnetically adhering said movable portion to said stationary pole member until the deflection force of said bender element exceeds the holding force of said magnetic circuit; one of said pole members being convergingly tapered toward its face.

* * * * *